United States Patent [19]

Yano et al.

[11] Patent Number: 5,700,362
[45] Date of Patent: Dec. 23, 1997

US005700362A

[54] METHOD OF TREATING COPPER FOIL FOR PRINTED CIRCUITS

[75] Inventors: Masami Yano, Kyoto; Masato Takami, Uji, both of Japan

[73] Assignee: Fukuda Metal Foil and Powder Co., Ltd., Kyoto, Japan

[21] Appl. No.: 666,030

[22] Filed: Jun. 19, 1996

Related U.S. Application Data

[62] Division of Ser. No. 417,873, Apr. 7, 1995, Pat. No. 5,567,534.

[30] Foreign Application Priority Data

Apr. 15, 1994 [JP] Japan .................................. 6-77158

[51] Int. Cl.$^6$ .............................. C23C 28/00; C25D 3/56
[52] U.S. Cl. ........................ 205/191; 205/196; 205/197; 205/245
[58] Field of Search ............................ 205/196, 197, 205/245, 191

[56] References Cited

U.S. PATENT DOCUMENTS

| | | | |
|---|---|---|---|
| 4,082,591 | 4/1978 | Morisaki et al. | 156/150 |
| 4,529,487 | 7/1985 | Hsu et al. | 205/196 |

Primary Examiner—Kathryn L. Gorgos
Assistant Examiner—Edna Wong
Attorney, Agent, or Firm—Edwin E. Greigg; Ronald E. Greigg

[57] ABSTRACT

A copper foil for printed circuits of which a shiny side has resin dust resistance, excels in heat discoloration resistance and rust preventiveness, and does not adversely affect the solderability and resist adhesion, and a method of treating the surface of such copper foil. The copper foil for a printed circuit comprises a first layer of zinc alloy composed of zinc and nickel and/or cobalt, formed on the shiny side surface of a copper foil, and a second layer composed of a mixture or compound of benzotriazole derivative and phosphorus compound (and silicon compound) formed on the layer. The method for treating the surface of a copper foil for a printed circuit comprises the steps of forming a first layer of zinc alloy composed of zinc and nickel and/or cobalt by electroplating on the shiny side surface of a copper foil, and forming a second layer by immersing it in an aqueous solution of benzotriazole derivative and phosphorus compound (and silicon compound).

22 Claims, No Drawings

METHOD OF TREATING COPPER FOIL FOR PRINTED CIRCUITS

This is a divisional of application Ser. No. 08/417,873 filed on Apr. 7, 1995 now U.S. Pat. No. 5,567,534.

BACKGROUND OF THE INVENTION

(1) Field of the Invention

The present invention relates to a copper foil for printed circuits, and more particularly to surface treatment on the shiny side thereof, and further particularly to a method of surface treatment for obtaining a copper foil for printed circuits having a shiny side, hardly allowing, when pressing with a resin substrate for printed circuits, particles of the applied resin substrate to fuse on the copper foil shiny side, and possessing heat discoloration resistance, solderability, resist adhesion, and rust preventiveness.

(2) Description of the Prior Art

Printed circuit boards are rapidly advanced every year, and requirements for higher performance and higher reliability are mounting. Accordingly, they are becoming more and more complicated and diversified. As conductive materials for printed circuits, copper foils are widely used, and strict quality demands are similarly imposed on these copper foils.

A first step in manufacture of a printed circuit board is to laminate a copper foil and a synthetic resin impregnated material, with the rough side of the copper foil abutting against the synthetic resin impregnated material, and to heat and press by a press machine to obtain a copper clad laminate plate. As the copper foil for printed circuits, an electrolytic copper foil is mainly used, and generally the non-shiny side is roughened in the electrolytic copper foil, and either side is roughened in the rolled copper foil, in order to increase adhesion with the resin, and various techniques have been developed for stabilizing the heat resistance, chemical resistance, adhesion characteristic, etching characteristic and others in order to assure adhesion with the resin, and thereby a high functional surface is provided.

On the other hand, completely different properties are demanded on the opposite side, that is, on the shiny side, such as heat discoloration resistance, solderability, and resist adhesion, and therefore different treating methods are needed and studied for the rough side and shiny side. The copper foils for printed circuits have been established as products requiring such advanced and characteristic treating technologies.

In the glass epoxy substrate that is used widely, a heating and pressing process is conducted for 1 or 2 hours at 160° to 170° C., but special high heat resistant resins such as glass polyimide substrates that are becoming popular recently need heating at 200° C. for 1 or 2 hours, or even at higher temperature and for a longer time.

Moreover, higher heat resistance is more often demanded year after year, such as post-curing for a long time at high temperature after a laminating process in order to improve dimensional precision. In other materials than glass epoxy substrates, such as flexible printed wiring boards, too, heat treatment at high temperature for a long time is being done. Accordingly, of the shiny side characteristics of the copper foil, the heat discoloration resistance is one of the particularly important characteristics.

Yet, when resin dust generated from the resin substrate mixes onto the copper shiny side at the time of lamination, the resist by the resin is formed in the area after the heating and pressing process, and this area is not removed by etching, and the copper is left over to cause a fatal defect such as shorting of circuits, and the value of the copper foil laminates is completely lost, which has been recently disclosed as a problem.

In the industry, various improvements have been attempted, such as cleaning of the field of heating and pressing process works and prevention of drops of prepreg dust, but if the resin dust deposits on the copper foil shiny side, the copper foil is required to have such surface treatment that it may not adhere and fuse on the copper foil at the time of heating and pressing. Hereinafter, the preventive effect of such resin dust adhesion is called resin dust resistance. This problem is particularly caused by the epoxy resin dust in FR-4, G-10, and CEM-3, and at the present its improving method has not been technically developed yet.

In the prior art, various techniques for offering heat discoloration resistance have been proposed, and, for example, Japanese patent publication No. 54-29187 discloses a method of immersing copper in an alkaline aqueous solution containing zinc, or being electrolyzed in the aqueous solution, using the copper as the anode, and Japanese patent publication No. 58-7077 discloses a method of forming a coating layer of a mixture of zinc or zinc oxide and chromium oxide. Besides, Japanese patent laid-open publication No. 5-140765 discloses a method of chromate treatment after forming a Zn—Ni alloy layer.

These conventional methods commonly have the defect of adhesion of the resin dust generated from the resin substrate, especially epoxy resin dust, to the copper foil shiny side at the time of lamination, thereby fusing and forming the resin dust in the area by heating and pressing. That is, all methods are extremely poor in the resin dust resistance. On the other hand, a layer of zinc or a layer of zinc or zinc oxide and chromium oxide or the like is excellent in solderability, but inferior in heat discoloration resistance and rust preventiveness, or a method of forming a chromate treated layer after forming a Zn—Ni alloy layer has a problem in solderability. Besides, chromium oxide or chromate treated layer is formed by using hexavalent chromium, but its use is not preferred from the viewpoint of environmental problem of which regulation is becoming stricter nowadays.

SUMMARY OF THE INVENTION

The present inventors widely studied the problems of the prior art, and particularly investigated the resin dust resistance as an important subject, and discovered that the copper foil for printed circuits having a shiny side satisfying all requirements, excellent in preventive effect of adhesion of resin dust from resin substrate (resin dust resistance), and possessing heat discoloration resistance, solderability, resist adhesion, and rust preventiveness, can be obtained, without using hexavalent chromium for the sake of environmental problem, by forming a first layer of zinc or zinc alloy coat film on the copper foil shiny side, and adding a second layer composed of benzotriazole derivative and phosphorus compound thereon, and thereby completed the invention.

That is, the invention relates to a copper foil for printed circuits characterized by forming a first layer of zinc and nickel and/or cobalt on a shiny side surface layer of a copper foil, and forming a second layer of a mixture or compound of benzotriazole derivative and phosphorus compound thereon, and, as required, the second layer is a mixture or compound of benzotriazole derivative and phosphorus compound or silicon compound.

The invention also relates to a surface treating method of copper foil for printed circuits comprising the steps of forming a first layer of zinc and zinc alloy with nickel and/or cobalt on a shiny side surface layer of a copper foil by electroplating, and forming a second layer thereby by immersing in an aqueous solution containing benzotriazole derivative and phosphorus compound. Moreover, as required, the second layer is formed by immersing in an aqueous solution containing benzotriazole derivative, phosphorus compound and silicon compound.

The first layer of the invention is described. The first layer is formed on the copper of the copper foil shiny side, and is composed of an alloy of zinc and nickel and/or cobalt, and exhibits the resin dust resistance, rust preventiveness, and heat discoloration resistance, through the synergistic effects with the mixture or compound layer of benzotriazole derivative and phosphorus compound of the second layer.

Of the zinc alloys, the most recommended one is the zinc alloy with nickel and/or cobalt. More specifically, a zinc alloy of 0.5 to 25 wt. % of nickel and/or cobalt and the remainder of zinc is preferred.

If the content of nickel and/or cobalt is less than 0.5 wt. %, the resin dust resistance and rust preventiveness obtained through synergistic effects with the second layer are lowered, or if exceeding 15 wt. %, the solderability and heat discoloration resistance are lowered, and the value for printed circuits is lost. The coat film thickness is preferably 15 to 50 mg/m$^2$. If less than 15 mg/m$^2$, the resin dust resistance and heat discoloration resistance are lowered, and if exceeding 50 mg/m$^2$, the yellow color is intensified by alloying with copper by heating in the pressing process, and it is a problem for the color of the appearance, and it is not economical.

The film may be formed in various manners, and industrially the plating method by electrolysis of aqueous solution is achieved most easily at low cost. The conditions for bath and electrolysis may be recommended as follows.

| | |
|---|---|
| $ZnSO_4 \cdot 7H_2O$ | 0.02 to 0.30 mol/l (5.8–86 g/l) |
| $NiSO_4 \cdot 6H_2O$ | 0.004 to 0.30 mol/l (1.1–79 g/l) |
| $CoSO_4 \cdot 7H_2O$ | 0.004 to 0.30 mol/l (1.1–84 g/l) |
| $CH_3COONa \cdot 3H_2O$ | 5 to 50 g/l |
| pH | 3.0 to 5.0 |
| Bath temperature | 25 to 35° C. |
| Current density | 0.1 to 1.0 A/dm$^2$ |
| Quantity of electricity | 0.5 to 2.0 coulombs/dm$^2$ |

The ratio by mol of zinc ions and nickel ions and/or cobalt ions is preferred to be in a range of Zn/(Co+Ni)=0.5 to 5.0. If the Zn ratio is small (about less than 0.5), nickel and/or cobalt tends to exceed 15 wt. % in the zinc alloy layer, and problems occur in the solderability and heat discoloration resistance, or to the contrary, if exceeding 5.0, nickel and/or cobalt is about less than 0.5 wt. % in the zinc alloy layer, and the resin dust resistance obtained through synergistic effect with the second layer is lowered, and the rust preventiveness and heat discoloration resistance are also impaired.

As the supply source of metal ions, sulfate, acetate, or citrate of each element is used.

Sodium acetate is preferably 5 to 50 g/liter, which plays the role of pH buffer. Preferably, the pH is 3 to 5, and if the pH is lower than 3, the deposited zinc is likely to dissolve again, and if the pH is higher than 5, sediment of hydroxide of zinc or nickel is likely to form, which is not recommended because the balance of alloy deposit of Zn—Ni and/or Co is hardly achieved. In addition to sodium acetate above, potassium acetate or acetic acid may be also used.

The second layer is described. After the first layer of the invention is formed, the second layer is formed, and this second layer is a mixture or compound of benzotriazole derivative and phosphorus compound. As required, a silicon compound may be also added. The second layer contributes to excellent resin dust resistance, and has synergistic effects with the first layer to provide excellent heat discoloration resistance and rust preventiveness. Moreover, the solderability and resist adhesion are not impeded.

Examples of benzotriazole derivative include, among others, benzotriazole, tolyl triazole (methyl benzotriazole), hydroxy benzotriazole, and carboxyl benzotriazole. It is preferred to be treated in an aqueous solution at concentration of 0.01 to 10 g/liter, more preferably 0.3 to 3 g/liter. They are easier to dissolve in an organic solvent than in water, but an aqueous solution is easy to apply in a manufacturing process.

Examples of phosphorus compound are trisodium phosphate, disodium hydrogen phosphate, sodium dihydrogen phosphate, tripotassium phosphate, dipotassium hydrogen phosphate, potassium dihydrogen phosphate, lithium phosphate, sodium pyrophosphate, potassium pyrophosphate, sodium tripolyphosphate, phosphoric acid, sodium hypophosphite, etc. The content is preferably 0.005 to 5 g/liter as phosphorus.

If both benzotriazole derivative and phosphorus compound are low in content, the resin dust resistance is poor, or when the benzotriazole derivative is low, the rust preventiveness is lowered, and when the phosphorus compound is low, the heat discoloration resistance drops. The pH of the second layer treating bath is preferably 5 to 11, and at both higher side and lower side of pH, it is not preferred because the zinc alloy of the first layer is dissolved.

The silicon compound includes a silane coupling agent, silicic acid, metasilicic acid, and silicic acid alkaline metal salt, and examples of a silane coupling agent are τ-amino propyl triethoxy silane, N-β-amino ethyl-τ-amino propyl trimethoxy silane, τ-glycidoxy propyl trimethoxy silane, τ-glycidoxy propyl methyl diethoxy silane, τ-ureidopropyl trimethoxy silane, etc. The content is preferred to be 0.01 to 1 g/liter as Si in an aqueous solution.

The first layer and second layer of the invention bring about the effects of the invention, and if either the first layer or the second layer is absent, the effects are not obtained.

As the second layer, the phosphorus compound and benzotriazole derivative exhibit sufficiently excellent effects in resin dust resistance and heat discoloration resistance, and when silicon compound is added, the effects are further enhanced, especially in the resin dust resistance.

EXAMPLES OF THE INVENTION

Embodiments of the invention are described below.

Embodiment 1

The shiny side of a 35 μm thick electrolytic copper foil was immersed in a bath

| Bath (A) | | |
|---|---|---|
| | $ZnSO_4 \cdot 7H_2O$ | 25 g/l |
| | $NiSO_4 \cdot 6H_2O$ | 25 g/l |
| | $CH_3COONa \cdot 3H_2O$ | 10 g/l |
| | pH | 3.5 |
| | temperature | 30° C. | for 3 seconds at 0.4 A/dm$^2$ to perform cathodic electrolysis, rinsed with water, and immersed in a second layer treating bath of composition No. 1 in Table 1 for 6 seconds at room temperature, rinsed with water, and dried. At this time, the pH of the second layer treating bath composition was adjusted as shown in Table 1 by using sodium hydroxide or sulfuric acid. The same operation was conducted in the subsequent embodiments and comparative examples were obtained.

The heat resistant characteristic, solderability, and rust preventiveness of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm$^2$, 170° C., and 60 minutes. Results of investigation of the shiny surface characteristics of the obtained copper clad laminate plate (resin dust resistance, adhesion, resist adhesion) are shown in Table 2.

Embodiments 2 to 5

The shiny side of 35 μm thick electrolytic copper foil was immersed in the same bath as bath (A) in Embodiment 1 for 3 seconds at 0.4 A/dm$^2$ to perform cathodic electrolysis, rinsed with water, and immersed in a second layer treating bath of composition No. 2 to 5 in Table 1 for 6 seconds at room temperature, rinsed with water, and dried. The heat resistant characteristic, solderability, and rust preventiveness of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm$^2$, 170° C., and 60 minutes. Results of investigation of the shiny surface characteristics of the obtained copper clad laminate (resin dust resistance, adhesion, resist adhesion) are shown in Table 2. As lithium silicate in No. 4 in Table 1, an aqueous solution of SiO$_2$ 19.5% and LiO$_2$ 2.4% was used.

Embodiment 6

The shiny side of a 35 μm thick electrolytic copper foil was immersed in a bath

| Bath (B) | ZnSO$_4$.7H$_2$O | 30 g/l |
| --- | --- | --- |
| | NiSO$_4$.6H$_2$O | 10 g/l |
| | CH$_3$COONa.3H$_2$O | 5 g/l |
| | pH | 4.0 |
| | temperature | 30° C. | for 5 seconds at 0.3 A/dm$^2$ to perform cathodic electrolysis, washed in water, and immersed in a second layer treating bath of composition No. 6 in Table 1 at room temperature, rinsed with water, and dried. The characteristics of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm$^2$, 170° C., and 60 minutes. Results of investigation of the shiny surface characteristics of the obtained copper lined laminate plate are shown in Table 2.

Embodiment 7

The shiny side of a 35 μm thick electrolytic copper foil was immersed in a bath

| Bath (C) | ZnSO$_4$.7H$_2$O | 20 g/l |
| --- | --- | --- |
| | NiSO$_4$.6H$_2$O | 22 g/l |

-continued

| | CH$_3$COONa.3H$_2$O | 15 g/l |
| --- | --- | --- |
| | pH | 4.5 |
| | temperature | 30° C. | for 5 seconds at 0.3 A/dm$^2$ to perform cathodic electrolysis, washed in water, and immersed in a second layer treating bath of composition No. 7 in Table 1 at room temperature, washed in water, and dried. The characteristics of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm$^2$, 170° C. and 60 minutes. Results of investigation of the shiny surface characteristics of the obtained copper clad laminate are shown in Table 2.

Embodiments 8, 9

The shiny side of a 35 μm thick electrolytic copper foil was immersed in a bath

| Bath (D) | ZnSO$_4$.7H$_2$O | 30 g/l |
| --- | --- | --- |
| | COSO$_4$.7H$_2$O | 20 g/l |
| | CH$_3$COONa.3H$_2$O | 10 g/l |
| | pH | 4.0 |
| | temperature | 30° C. | for 3 seconds at 0.4 A/dm$^2$ to perform cathodic electrolysis, rinsed with water, and immersed in a second layer treating bath of composition No. 8, 9 in Table 1 at room temperature, rinsed with water, and dried. The characteristics of the shiny side of the copper foil were investigated, of which results are shown in Table 2.

This copper foil was laminated on a glass epoxy resin impregnated substrate of FR-4 grade, and formed by heating and pressing in the conditions of pressure of 40 kgf/cm$^2$, 170° C., and 60 minutes. Results of investigation of the shiny surface characteristics of the obtained copper clad laminate are shown in Table 2.

Embodiments 10, 11

The shiny side of a 35 μm thick electrolytic copper foil was immersed in a bath

| Bath (E) | ZnSO$_4$.7H$_2$O | 30 g/l |
| --- | --- | --- |
| | NiSO$_4$.6H$_2$O | 18 g/l |
| | COSO$_4$.7H$_2$O | 10 g/l |
| | CH$_3$COONa.3H$_2$O | 10 g/l |
| | pH | 4.5 |
| | temperature | 30° C. | for 3 seconds at 0.4 A/dm$^2$ to perform cathodic electrolysis, rinsed with water, and immersed in a second layer treating bath of composition No. 10, 11 in Table 1 at room temperature, rinsed with water, and dried. The characteristics of the shiny side of the copper foil were investigated, of which results are shown in Table 2.

This copper foil was laminated on a glass epoxy resin impregnated substrate of FR-4 grade, and formed by heating and pressing in the conditions of pressure of 40 kgf/cm$^2$, 170° C., and 60 minutes. Results of investigation of the shiny surface characteristics of the obtained copper clad laminate are shown in Table 2.

Embodiment 12

The shiny side of a 35 μm thick electrolytic copper foil was immersed in a bath

| Bath (F) | $ZnSO_4 \cdot 7H_2O$ | 25 g/l |
| --- | --- | --- |
| | $NiSO_4 \cdot 6H_2O$ | 10 g/l |
| | $CoSO_4 \cdot 7H_2O$ | 10 g/l |
| | $CH_3COONa \cdot 3H_2O$ | 10 g/l |
| | pH | 4.0 |
| | temperature | 30° C. | for 3 seconds at 0.4 A/dm² to perform cathodic electrolysis, rinsed with water, and immersed in a second layer treating bath of composition No. 12 in Table 1 at room temperature, rinsed with water, and dried. The characteristics of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm², 170° C., and 60 minutes. Results of investigation of the shiny surface characteristics of the obtained copper clad laminate are shown in Table 2.

Comparative Example 1

The shiny side of a 35 μm thick electrolytic copper foil was immersed in an electrolytic bath (A) same as in Embodiment 1 for 3 seconds at 0.4 A/dm2 to perform cathodic electrolysis, rinsed with water, and dried. The characteristics of the shiny side of the copper foil were investigated, of which results are shown in Table 2.

This copper foil was laminated on a glass epoxy resin impregnated substrate of FR-4 grade, and formed by heating and pressing in the conditions of pressure of 40 kgf/cm², 170° C., and 60 minutes. Results of investigation of the shiny surface characteristics of the obtained copper clad laminate are shown in Table 2.

Comparative Example 2

The shiny side of a 35 μm thick electrolytic copper foil was immersed in an aqueous solution of 1 g/liter of tolyl triazole, 3 g/liter of dipotassium hydrogen phosphate, and 1 ml/liter of τ-amino propyl triethoxy silane for 6 seconds. It was then rinsed with water, and dried. The characteristics of the shiny side of the copper foil were investigated, of which results are shown in Table 2.

This copper foil was laminated on a glass epoxy resin impregnated substrate of FR-4 grade, and formed by heating and pressing in the conditions of pressure of 40 kgf/cm², 170° C., and 60 minutes. Results of investigation of the shiny surface characteristics of the obtained copper clad laminate are shown in Table 2.

Comparative Example 3

The shiny side of a 35 μm thick electrolytic copper foil was immersed in an electrolytic bath (A) same as in Embodiment 1 for 3 seconds at 0.4 A/dm² to perform cathodic electrolysis, rinsed with water, and immersed in an aqueous solution of 0.5 g/liter of tolyl triazole (pH 6.0) for 6 seconds. It was then washed in water and dried. The characteristics of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm², 170° C., and 60 minutes. Results of investigation of the shiny surface characteristics of the obtained copper clad laminate are shown in Table 2.

Comparative Example 4

The shiny side of a 35 μm thick electrolytic copper foil was immersed in a bath

| Bath (G) | $ZnSO_4 \cdot 7H_2O$ | 20 g/l |
| --- | --- | --- |
| | $NiSO_4 \cdot 6H_2O$ | 10 g/l |
| | pH | 3.0 |
| | temperature | 40° C. | for 3 seconds at 0.4 A/dm² to perform cathodic electrolysis, rinsed with water, and immersed in an aqueous solution of 1 g/liter of $K_2Cr_2O_7$ at pH 2.0, 40° C. for 5 seconds, rinsed with water, and dried. The characteristics of the shiny side of the copper foil were investigated, of which results are shown in Table 2. This copper foil was laminated on a glass epoxy resin impregnated substrate of FR-4 grade, and formed by heating and pressing in the conditions of pressure of 40 kgf/cm², 170° C., and 60 minutes. Results of investigation of the shiny surface characteristics of the obtained copper clad laminate are shown in Table 2.

Comparative Example 5

The shiny side of a 35 μm thick electrolytic copper foil was immersed in a bath

| Bath (H) | $ZnSO_4 \cdot 7H_2O$ | 20 g/l |
| --- | --- | --- |
| | $Na_2Cr_2O_7 \cdot 2H_2O$ | 10 g/l |
| | NaOH | 50 g/l |
| | temperature | 25° C. | for 5 seconds at 0.3 A/dm² to perform cathodic electrolysis, rinsed with water, and dried. The characteristics of the shiny side of the copper foil were investigated, of which results are shown in Table 2.

This copper foil was laminated on a glass epoxy resin impregnated substrate of FR-4 grade, and formed by heating and pressing in the conditions of pressure of 40 kgf/cm², 170° C., and 60 minutes. Results of investigation of the shiny surface characteristics of the obtained copper clad laminate are shown in Table 2.

TABLE 1

| | No. | 1st layer bath | 2nd layer bath | |
| --- | --- | --- | --- | --- |
| Embodiment | 1 | A | Tolyl triazole 0.5 g/l | |
| | | | Dipotassium hydrogen phosphate 5 g/l | pH 8.2 |
| | 2 | A | Tolyl triazole 0.5 g/l | |
| | | | Dipotassium hydrogen phosphate 1.0 g/l | |
| | | | γ-Amino propyl triethoxy silane 0.5 ml/l | pH 9.0 |

TABLE 1-continued

| | No. | 1st layer bath | 2nd layer bath | |
|---|---|---|---|---|
| | 3 | A | Tolyl triazole 1.0 g/l<br>Disodium hydrogen phosphate 2.0 g/l<br>γ-Amino propyl triethoxy silane 0.5 g/l | pH 7.9 |
| | 4 | A | Tolyl triazole 1.0 g/l<br>Disodium hydrogen phosphate 2.0 g/l<br>Lithium silicate 1.0 ml/l | pH 9.0 |
| | 5 | A | Benzotriazole 0.3 g/l<br>Dipotassium hydrogen phosphate 2.0 g/l<br>γ-Amino propyl triethoxy silane 0.5 ml/l | pH 8.7 |
| | 6 | B | Tolyl triazole 0.5 g/l<br>Disodium hydrogen phosphate 0.1 g/l<br>γ-Amino propyl triethoxy silane 0.5 ml/l | pH 8.3 |
| | 7 | C | Tolyl triazole 0.5 g/l<br>Dipotassium hydrogen phosphate 0.2 g/l<br>N-β-Amino ethyl-γ-amino propyl trimethoxy silane 1.0 ml/l | pH 8.9 |
| | 8 | D | Tolyl triazole 0.5 g/l<br>Dipotassium hydrogen phosphate 1.0 g/l | pH 9.0 |
| | 9 | D | Tolyl triazole 1.0 g/l<br>Disodium hydrogen phosphate 3.0 g/l<br>γ-Amino propyl triethoxy silane 1.0 ml/l | pH 8.7 |
| | 10 | E | Tolyl triazole 1.0 g/l<br>Disodium hydrogen phosphate 1.0 g/l<br>γ-Glycidoxy propyl trimethoxy silane 1.0 ml/l | pH 9.0 |
| | 11 | E | Tolyl triazole 1.0 g/l<br>Disodium hydrogen phosphate 1.0 g/l<br>γ-Amino propyl triethoxy silane 1.0 ml/l | pH 9.5 |
| | 12 | F | Tolyl triazole 1.0 g/l<br>Disodium hydrogen phosphate 1.0 g/l<br>γ-Amino propyl triethoxy silane 1.0 ml/l | pH 9.0 |
| Comparative Example | 1 | A | None | |
| | 2 | None | Tolyl trizole 1.0 g/l<br>Disodium hydrogen phosphate 3.0 g/l<br>y-Amino propyl triethoxy silane 1.0 ml/l | pH 8.7 |
| | 3 | A | Tolyl triazole 0.5 g/l | |
| | 4 | G | Potassium bichromate 1 g/l, pH 2.0, 40° C., 5 sec immersion | |
| | 5 | H | None | |

TABLE 2

| | | Resin dust resistance | Surface adhesion (kgf/cm) | Heat resistance | | Solder-ability | Resist adhesion | Rust pre-ventiveness | Quantity of deposit (mg/m²) | | |
|---|---|---|---|---|---|---|---|---|---|---|---|
| | No | | | 240° C. 1 hr. | 270° C. 1 hr. | | | | Zn | Ni | Co |
| Embodiment | 1 | □ | 0.16 | ○ | ○ | ○ | ○ | ○ | 25 | 2.0 | 0 |
| | 2 | ○ | 0.14 | ○ | ○ | ○ | ○ | ○ | 24 | 2.0 | 0 |
| | 3 | ○ | 0.10 | ○ | ○ | ○ | ○ | ○ | 26 | 2.0 | 0 |
| | 4 | ○ | 0.08 | ○ | ○ | ○ | ○ | ○ | 25 | 1.9 | 0 |
| | 5 | □ | 0.21 | ○ | ○ | ○ | ○ | ○ | 22 | 2.3 | 0 |
| | 6 | □ | 0.08 | ○ | ○ | ○ | ○ | ○ | 39 | 2.1 | 0 |
| | 7 | ○ | 0.14 | ○ | ○ | ○ | ○ | ○ | 27 | 1.9 | 0 |
| | 8 | □ | 0.13 | ○ | ○ | ○ | ○ | ○ | 28 | 0 | 0.9 |
| | 9 | ○ | 0.09 | ○ | ○ | ○ | ○ | ○ | 29 | 0 | 0.9 |
| | 10 | □ | 0.12 | ○ | □ | ○ | ○ | ○ | 28 | 1.2 | 0.5 |
| | 11 | ○ | 0.15 | ○ | ○ | ○ | ○ | ○ | 30 | 1.4 | 0.5 |
| | 12 | ○ | 0.10 | ○ | ○ | ○ | ○ | ○ | 29 | 1.0 | 0.6 |
| Comparative Example | 1 | × | 0.19 | ○ | □ | ○ | ○ | △ | 23 | 2.0 | 0 |
| | 2 | △ | 0.37 | ×× | ×× | ○ | ○ | ○ | 0 | 0 | 0 |
| | 3 | × | 0.19 | ○ | △ | ○ | ○ | ○ | 22 | 2.0 | 0 |
| | 4 | × | 0.38 | ○ | × | × | ○ | ○ | 25 | 4.2 | 0 |
| | 5 | × | 0.30 | ×× | ×× | ○ | ○ | × | 12 | 0 | 0 |

In Table 2, the resin dust resistance was judged by scattering resin particles on the shiny side when pressing on the FR-4 grade resin substrate with the copper foil shiny side up, and visually observing their fusion state after pressing. Comparative Example 1 was evaluated as X, which shows an ordinary copper foil state of fusing and spreading of scattered resin particles. Evaluation of ○ mark is the state in which the scattered resin particles are hardly spread. Thus, depending on the degree of fusing and spreading of the resin, the result was judged as ○, □, Δ, X.

The surface adhesion refers to the peeling strength from the substrate, conforming to the method of 5.7 in JIS C 6481 (1986). The lower value of peeling strength tends to be less likely to stick resin particles. However, if this adhesion is relatively high, resin particles may be hard to stick in certain cases.

To evaluate the heat resistance, the copper foil was put in an air circulating oven, and heat discoloration of the shiny side was observed. The result was judged in the following rating.

| | |
|---|---|
| ○ | No discoloration |
| □ | Slight discoloration |
| Δ | Little discoloration |
| x | Discoloration overall |
| xx | Strong discoloration overall |

The solderability was nearly based on item 4.5.12 of IPC-MF-150F, and the copper foil was immersed in an aqueous solution of 1/10N hydrochloric acid at 25° C. for 10 seconds, rinsed with water, dried, coated with WWG rosin flux, and immersed in a 235° C. solder bath, then the wettability was visually judged. The rating ranges from complete wetting marked by ○ and almost no wetting by X.

In testing of resist adhesion, after press forming into a resin substrate of FR-4 grade, UV etching resist was screen printed, and cured by a UV exposure equipment, and the hardness of the coat film was measured by the pencil hardness method. The mark shows the hardness was 4 H or more.

In a rust preventive test, the copper foil was kept in a thermohygrostat of 60° C. and 85% relative humidity for 72 hours, and the degree of oxidation discoloration was visually observed. The result was judged in order of ○, Δ, and X. By the way, deposits of zinc, nickel and cobalt of the first layer are shown in Table 2. In the method of analysis, the copper foil was dissolved in nitric acid, and metal ions were analyzed by ICP emission spectral analysis.

As known from the embodiments, copper foils having an excellent resin dust resistance can be obtained according to the invention. The surface adhesion does not always coincide with the resin dust resistance, but the lower the adhesion, it tends to be higher in the resin dust resistance. Moreover, the invention features an excellent heat resistance of 24° C. for 1 hour or more, and is also excellent in rust preventiveness without adverse effects on solderability and resist adhesion.

Thus, the invention can solve the problems of resin particle sticking from the substrate (resin dust), in particular the problems of epoxy resin fusion, and presents a copper foil for printed circuits having extremely advanced shiny surface characteristics with excellent heat discoloration resistance, rust preventiveness, solderability, and resist adhesion. It is hence considered to contribute greatly to improvement of yield in the manufacture of copper clad laminate and printed wiring board. What is more, this surface treating method is easy, and is mass producible. The invention does not make use of hexavalent chromium, and is therefore very advantageous for the environmental policy.

The foregoing relates to preferred exemplary embodiments of the invention, it being understood that other variants and embodiments thereof are possible within the spirit and scope of the invention, the latter being defined by the appended claims.

We claim:

1. A method for surface treating cooper foil having a shiny side for printed circuits comprising:

a step of forming a first layer of a zinc alloy of zinc and nickel and cobalt by electroplating the shiny side surface of said copper foil, and a step of forming a second layer by immersing the first layer in an aqueous solution bath containing benzotriazole derivative and a phosphorus compound.

2. A method of surface treating copper foil having a shiny side for printed circuits of claim 1, wherein the second layer is formed by immersing in an aqueous solution bath containing the benzotriazole derivative, the phosphorus compound, and a silicon compound.

3. A method of surface treating copper foil having a shiny side for printed circuits of claim 2, wherein the silicon compound is selected from the group consisting of a silane coupling agent, silicic acid, metasilicic acid, and silicic acid alkaline metal salt.

4. A method of surface treating copper foil having a shiny side for printed circuits of claim 3, wherein the silane coupling agent is selected from the group consisting of τ-amino propyl triethoxy silane, N-β-amino ethyl-τ -amino propyl trimethoxy silane, τ-glycidoxy propyl trimethoxy silane, τ-glycidoxy propyl methyl diethoxy silane, and τ-ureidopropyl trimethoxy silane.

5. A method of surface treating copper foil having a shiny side for printed circuits of claim 3, wherein the silicon compound is in an aqueous solution with Si content of 0.01 to 1 g/liter.

6. A method of surface treating copper foil having a shiny side for printed circuits of claim 2, wherein a ratio by mol of zinc ions, nickel ions and cobalt ions is in a range of Zn/(Co+Ni)=0.5 to 5.0.

7. A method of surface treating copper foil having a shiny side for printed circuits of claim 2, wherein a pH of an electrolytic treating bath is 3 to 5.

8. A method of surface treating copper foil having a shiny side for printed circuits of claim 2, wherein the benzotriazole derivative is selected from the group consisting of benzotriazole, tolyl triazole (methyl benzotriazole), hydroxy benzotriazole, and carboxyl benzotriazole.

9. A method of surface treating copper foil having a shiny side for printed circuits of claim 2, wherein the benzotriazole derivative is in the aqueous solution at a concentration of from 0.01 to 10 g/liter.

10. A method of surface treating copper foil having a shiny side for printed circuits of claim 2, wherein the phosphorus compound is selected from a group consisting of trisodium phosphate, disodium hydrogen phosphate, sodium dihydrogen phosphate, tripotassium phosphate, dipotassium hydrogen phosphate, potassium dihydrogen phosphate, lithium phosphate, sodium pyrophosphate, potassium pyrophosphate, sodium tripolyphosphate, phosphoric acid, and sodium hypophosphite.

11. A method of surface treating copper foil having a shiny side for printed circuits of claim 10, wherein the phosphorus compound is in an aqueous solution with phosphorus content of 0.005 to 5 g/liter.

12. A method of surface treating copper foil having a shiny side for printed circuits of claim 2, wherein a pH of the aqueous solution bath containing the benzotriazole derivative, the phosphorus compound, and the silicon compound is 5 to 11.

13. A method of surface treating copper foil having a shiny side for printed circuits of claim 2, wherein the benzotriazole derivative is in the aqueous solution at a concentration of from 0.2 to 3 g/liter.

14. A method of surface treating copper foil having a shiny side for printed circuits of claim 1, wherein the zinc alloy is formed in the following electrolytic bath and electrolytic conditions:

| | |
|---|---|
| $ZnSO_4 \cdot 7H_2O$ | 0.02 to 0.30 mol/l (5.8–86 g/l) |
| $NiSO_4 \cdot 6H_2O$ | 0.004 to 0.30 mol/l ([0] 1.1–79 g/l) |
| $CoSO_4 \cdot 7H_2O$ | 0.004 to 0.30 mol/l ([0] 1.1–84 g/l) |
| $CH_3COONa \cdot 3H_2O$ | 5 to 50 g/l |
| pH | 3.0 to 5.0 |
| Bath temperature | 25 to 35° C. |
| Current density | 0.1 to 1.0 A/dm$^2$ |
| Quantity [if] of electricity is 0.5 to 2.0 coulombs/dm$^2$. | |

15. A method of surface treating copper foil having a shiny side for printed circuits of claim 1, wherein a ratio by mol of zinc ions, nickel ions and cobalt ions is in a range of Zn/(Co+Ni)=0.5 to 5.0.

16. A method of surface treating copper foil having a shiny side for printed circuits of claim 1, wherein a pH of an electrolytic treating bath is 3 to 5.

17. A method of surface treating copper foil having a shiny side for printed circuits of claim 1, wherein the benzotriazole derivative is selected from the group consisting of benzotriazole, tolyl triazole (methyl benzotriazole), hydroxy benzotriazole, and carboxyl benzotriazole.

18. A method of surface treating copper foil having a shiny side for printed circuits of claim 1, wherein the benzotriazole derivative is in the aqueous solution at a concentration of from 0.01 to 10 g/liter.

19. A method of surface treating copper foil having a shiny side for printed circuits of claim 1, wherein the phosphorus compound is selected from a group consisting of trisodium phosphate, disodium hydrogen phosphate, sodium dihydrogen phosphate, tripotassium phosphate, dipotassium hydrogen phosphate, potassium dihydrogen phosphate, lithium phosphate, sodium pyrophosphate, potassium pyrophosphate, sodium tripolyphosphate, phosphoric acid, and sodium hypophosphite.

20. A method of surface treating copper foil having a shiny side for printed circuits of claim 19, wherein the phosphorus compound is in an aqueous solution with phosphorus content of 0.005 to 5 g/liter.

21. A method of surface treating copper foil having a shiny side for printed circuits of claim 1, wherein a pH of the aqueous solution bath containing the benzotriazole derivative and the phosphorus compound is 5 to 11.

22. A method of surface treating copper foil having a shiny side for printed circuits of claim 1, wherein the benzotriazole derivative is in the aqueous solution at a concentration of from 0.2 to 3 g/liter.

* * * * *